(12) United States Patent
Kim et al.

(10) Patent No.: US 11,373,892 B2
(45) Date of Patent: Jun. 28, 2022

(54) SYSTEM AND METHOD FOR WAFER PROCESSING

(71) Applicant: XIA TAI XIN SEMICONDUCTOR (QING DAO) LTD., Qingdao (CN)

(72) Inventors: Sung-Ki Kim, Singapore (SG); Jong-Moo Choi, Singapore (SG); Chiku Choi, Singapore (SG); Eun-Joung Lee, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 65 days.

(21) Appl. No.: 16/788,103

(22) Filed: Feb. 11, 2020

(65) Prior Publication Data

US 2021/0143042 A1    May 13, 2021

(30) Foreign Application Priority Data

Nov. 8, 2019    (CN) .......................... 201911090224.5

(51) Int. Cl.
*H01L 21/68*    (2006.01)
*H01L 21/67*    (2006.01)
*H01L 21/02*    (2006.01)

(52) U.S. Cl.
CPC ...... *H01L 21/682* (2013.01); *H01L 21/67178* (2013.01); *H01L 21/02271* (2013.01)

(58) Field of Classification Search
CPC ......... H01L 21/02271; H01L 21/67178; H01L 21/67259; H01L 21/67757; H01L 21/682
See application file for complete search history.

(56) References Cited

U.S. PATENT DOCUMENTS

| | | | |
|---|---|---|---|
| 2016/0247699 A1* | 8/2016 | Kamimura | H01L 21/67769 |
| 2017/0194183 A1* | 7/2017 | Xu | H01L 21/68707 |
| 2019/0204144 A1* | 7/2019 | Oishi | G06F 9/3004 |
| 2020/0168491 A1* | 5/2020 | Miyada | H01L 21/67778 |

FOREIGN PATENT DOCUMENTS

KR    20060089032 A    8/2006

* cited by examiner

*Primary Examiner* — Mohammed Shamsuzzaman
(74) *Attorney, Agent, or Firm* — ScienBiziP, P.C.

(57) ABSTRACT

A method for preventing a collision in a wafer processing system is provided. The method includes aligning a first sensor and a second sensor. The first sensor is disposed on a predetermined position of an elevating member connected to a bottom of a vertical wafer boat of the wafer processing system, and the second sensor is disposed on a shutter of a chamber of the wafer processing system. The method further includes activating the first sensor and the second sensor to monitor a path alongside the vertical wafer boat when the chamber is closed by the shutter.

5 Claims, 3 Drawing Sheets

SYSTEM AND METHOD FOR WAFER PROCESSING

CROSS REFERENCE TO RELATED APPLICATION(S)

The present application claims priority and the benefit of Chinese Application No. 201911090224.5, filed on Nov. 8, 2019, the contents of which are incorporated herein by reference.

FIELD

The present disclosure relates to semiconductor wafer processing system and more specifically to a system having sensors to prevent a collision between a vertical wafer boat and a chamber.

BACKGROUND

When a vertical wafer boat is being transferred into a reactor, vibration may cause leaning of the vertical wafer boat. A collision between the vertical wafer boat and the reactor would cause damage to both components. Particularly, repair of the reactor or replacement of the vertical wafer boat would increase down time on the manufacturing line.

SUMMARY

The following presents a summary of examples of the present disclosure in order to provide a basic understanding of at least some of its examples. This summary is not an extensive overview of the present disclosure. It is not intended to identify key or critical elements of the present disclosure or to delineate the scope of the present disclosure. The following summary merely presents some concepts of the present disclosure in a general form as a prelude to the more detailed description provided below.

In one example, a method is provided for preventing a collision in a wafer processing system. The method includes aligning a first sensor and a second sensor. The first sensor is disposed on a predetermined position of an elevating member connected to a bottom of a vertical wafer boat of the wafer processing system, and the second sensor is disposed on a shutter of a chamber of the wafer processing system. The method further includes activating the first sensor and the second sensor to monitor a path alongside the vertical wafer boat when the chamber is closed by the shutter.

In another example, a wafer processing system includes a chamber, a shutter disposed at an entrance of the chamber, a vertical wafer boat for loading wafers, an elevating member connected to a bottom of the vertical wafer boat and a pair of sensors. One of the pair of sensors is disposed on a predetermined position of an elevating member, and another of the pair of sensors is disposed on the shutter. The pair of sensors are aligned for monitoring a path alongside the vertical wafer boat when the chamber is closed by the shutter.

The details of one or more examples are set forth in the accompanying drawings and description below.

BRIEF DESCRIPTION OF THE DRAWINGS

The accompanying drawings illustrate one or more implementations of the present disclosure and, together with the written description, explain the principles of the present disclosure. Wherever possible, the same reference numbers are used throughout the drawings referring to the same or like elements of an implementation.

DETAILED DESCRIPTION

Figure 1A:
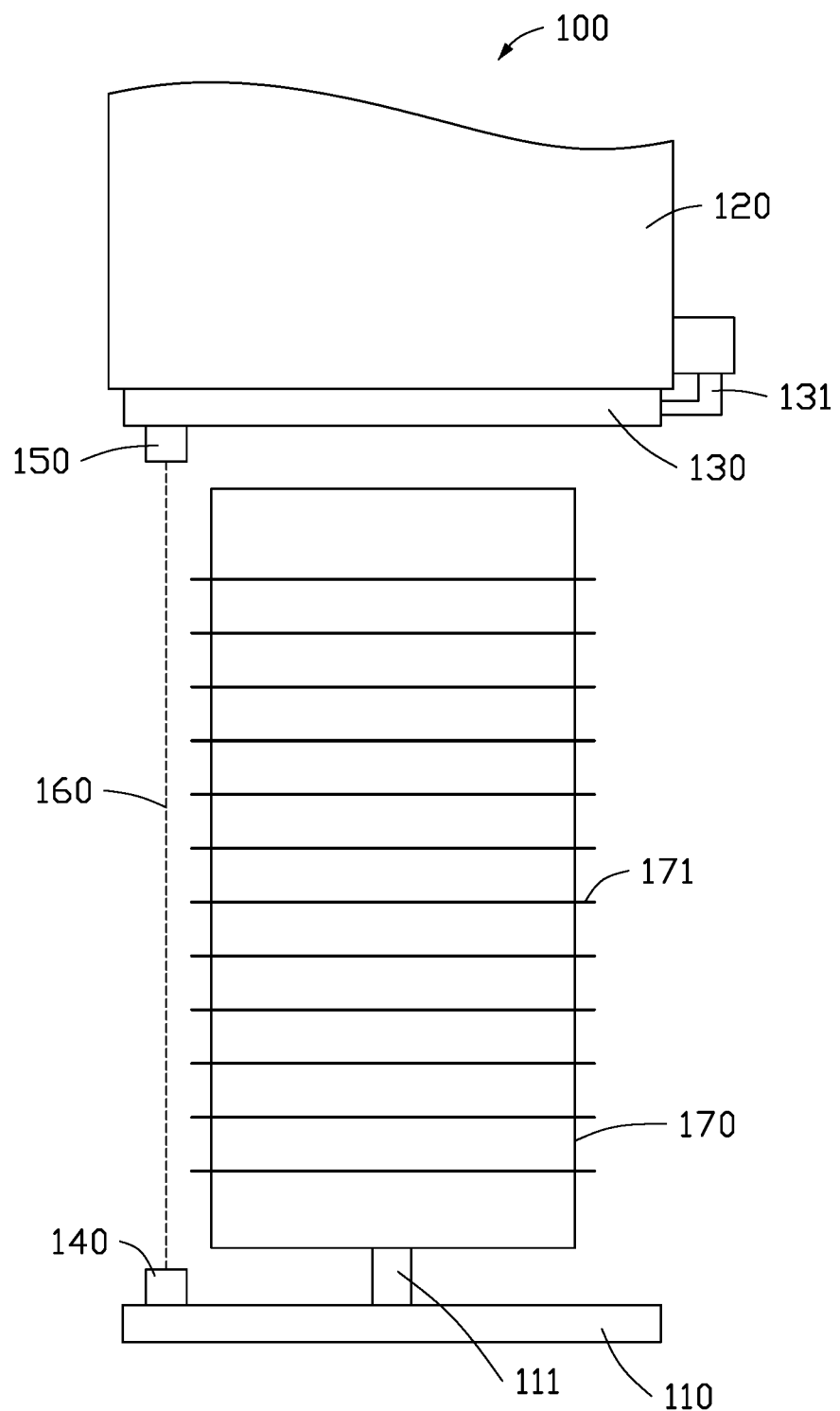
FIG. 1A is a schematic illustration of a wafer processing system in accordance with an implementation of the present disclosure.

To facilitate an understanding of the principles and features of the various implementations of the present disclosure, various illustrative implementations are explained below. Although exemplary implementations of the present disclosure are explained in detail, it is to be understood that other implementations are contemplated. Accordingly, it is not intended that the present disclosure is limited in its scope to the details of construction and arrangement of components set forth in the following description or illustrated in the drawings. The present disclosure is capable of other implementations and of being practiced or carried out in various ways.

FIG. 1A illustrates a wafer processing system 100 in accordance with an implementation of the present disclosure. The wafer processing system 100 includes a chamber 120, a shutter 130 disposed at an entrance of the chamber 120, a vertical wafer boat 170 for loading wafers 171, an elevating member 110 connected to a bottom of the vertical wafer boat 170 by a support rod 111, and a pair of sensors including a first sensor 140 and a second sensor 150. The first sensor 140 is disposed on a predetermined position of the elevating member 110, and the second sensor 150 is disposed on the shutter 130. For example, the first sensor 140 is mounted on the edge of the elevating member 110 and configured to face upward. The second sensor 150 is mounted on the edge of the shutter 130 and configured to face downward. In some implementations, the wafer processing system 100 may include more than one pairs of sensors.

The chamber 120 may be a furnace or a tube for deposition process, such as vertical low pressure chemical vapor deposition (LPCVD). The shutter 130 is movable; a control module 131 of the wafer processing system 100 may close or open the chamber 120 by horizontally rotating the shutter 130. The vertical wafer boat 170 may be lifted or descended by the elevating member 110.

In some implementations, the first sensor 140 and the second sensor 150 are aligned for monitoring a path 160 alongside the vertical wafer boat 170 when the chamber 120 is closed by the shutter 130, as shown in FIG. 1A. Upon activation, one of the first sensor 140 and the second sensor 150 transmits a signal along the path 160 to another of the first sensor 140 and the second sensor 150. For example, the first sensor 140 and the second sensor 150 may be optical sensors such as laser sensors namely, a light emitter and a light detector. A visible laser light is transmitted along the path 160 by one of the first and second sensors 140, 150 which is the light emitter. The distance between the first sensor 140 and the second sensor 150 may be up to 10 meters. Preferably, the first sensor 140 and the second sensor 150 are heat resistant to over 600 degree Celsius.

Figure 1B:
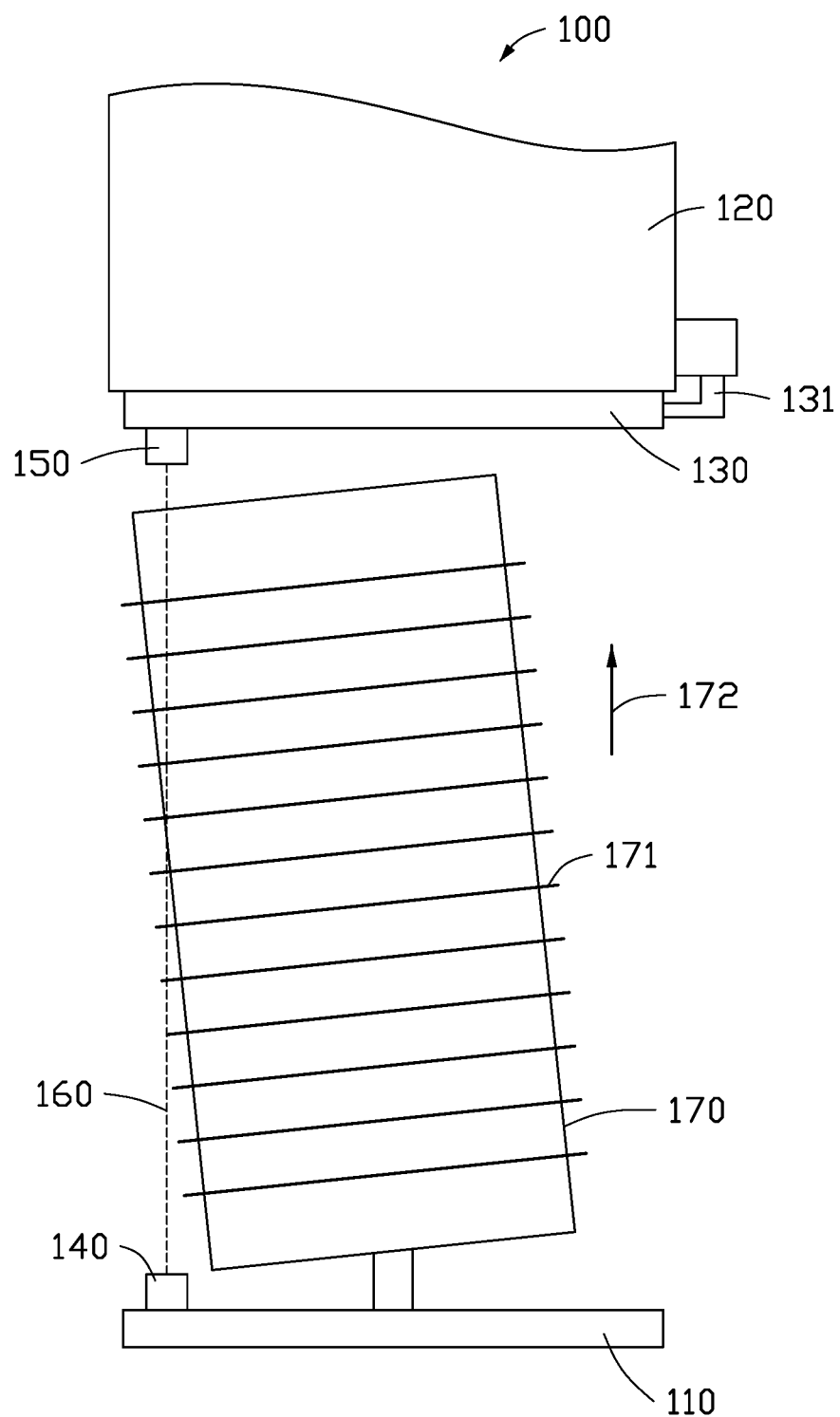
FIG. 1B is an example schematic view of the wafer processing system when an obstruction is detected by sensors.
Figure 1C:
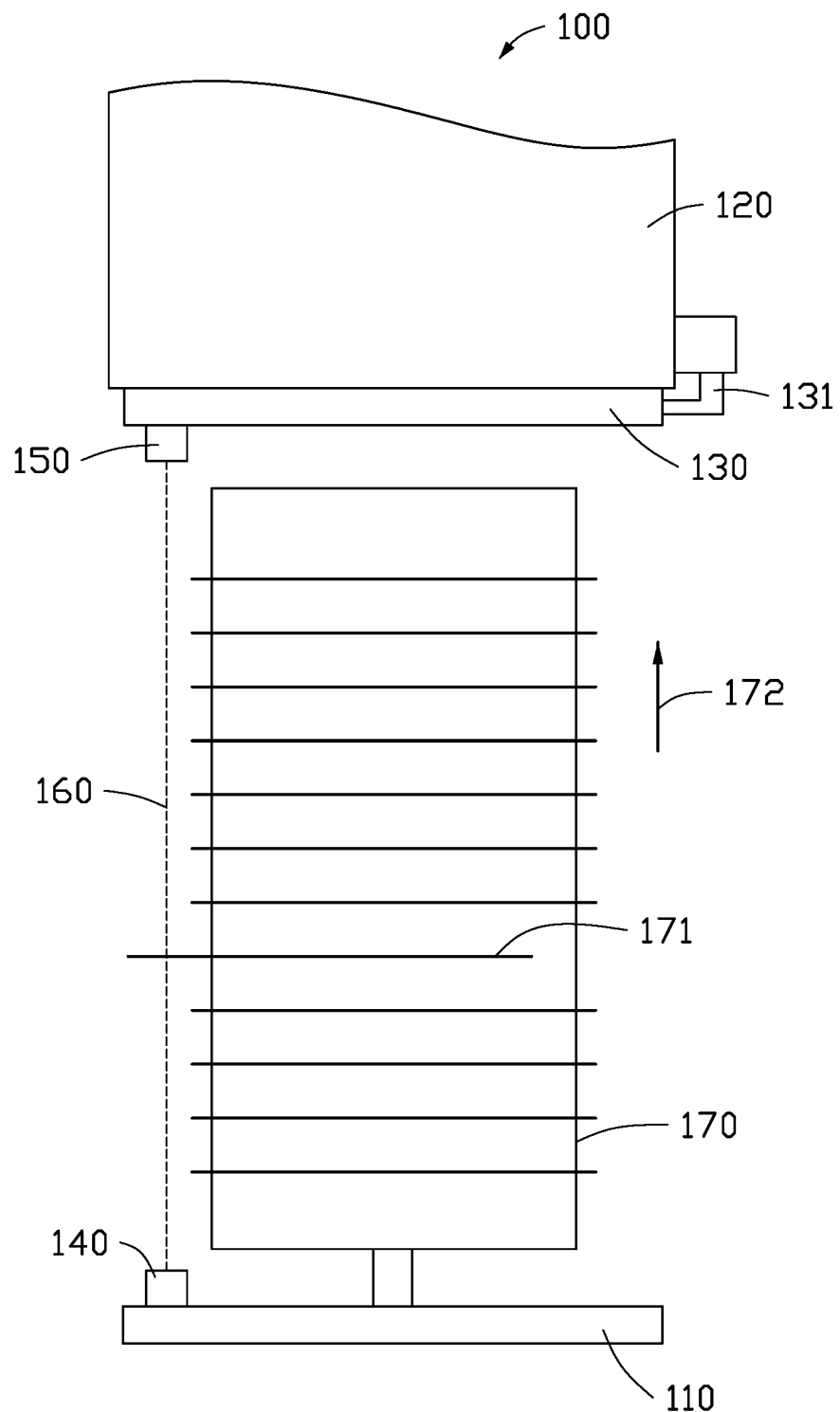
FIG. 1C is an example schematic view of the wafer processing system when an obstruction is detected by sensors.

FIGS. 1B to 1C illustrates exemplary schematic views of the wafer processing system 100 when an obstruction on the path 160 is detected. The wafer processing system 100 may further include a monitoring unit (not shown) for receiving data from the first sensor 140 and/or the second sensor 150. The monitoring unit is configured to monitor the path 160 for preventing a collision between the vertical wafer boat 170 and the chamber 120 when the vertical wafer boat 170 is being lifted by the elevating member 110 for entering the chamber 120 as indicated by an arrow 172. Preferably, the control module 131 opens the chamber 120 when the vertical wafer boat 170 reaches a predefined distance away from the entrance. As the shutter 130 moves to a predetermined position to make way for the vertical wafer boat 170, the sensor detection is temporarily disabled.

In an example of a circumstance that the vertical wafer boat 170 is inclined during vertical movement, the monitoring unit generates an alert when the signal on the path 160 is blocked by a portion of the vertical wafer boat 170, as shown in FIG. 1B. Additionally or optionally, the wafer processing system 100 may pause the operation when the alert is generated.

In an example of a circumstance that the wafer 171 is deviated or moves away from the slot of the vertical wafer boat 170, the monitoring unit generates an alert when the signal on the path 160 is blocked by the wafer falling out from the vertical wafer boat 170, as shown in FIG. 1C. Additionally or optionally, the wafer processing system 100 may pause the operation when the alert is generated.

Similar to loading the vertical wafer boat 170 into the chamber 120, the monitoring unit may monitor the path 160 when the vertical wafer boat 170 is unloaded from the chamber 120. When the top surface of the descending vertical wafer boat 170 leaves the chamber 120, the shutter 130 is closed. Accordingly, the sensor detection is enabled. Any obstruction detected on the path 160 during the period that the vertical wafer boat 170 returns to the original position, an alert may be generated by the monitoring unit.

By implementing the system and method of the implementations of the present disclosure, a collision between a vertical wafer boat and a chamber may be avoided.

The terminology used herein is for the purpose of describing particular implementations only and is not intended to be limiting of implementations of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, actions, operations, elements, and/or components, but do not preclude the presence or addition of one or more other features, integers, steps, actions, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to implementations of the present disclosure in the form disclosed. Many modifications and variations will be apparent to those of ordinary skill in the art without departing from the scope and spirit of implementations of the present disclosure. The implementation was chosen and described in order to best explain the principles of implementations of the present disclosure and the practical application, and to enable others of ordinary skill in the art to understand implementations of the present disclosure for various implementations with various modifications as are suited to the particular use contemplated.

Although specific implementations have been illustrated and described herein, those of ordinary skill in the art appreciate that any arrangement which is calculated to achieve the same purpose may be substituted for the specific implementations shown and that implementations of the present disclosure have other applications in other environments. This present disclosure is intended to cover any adaptations or variations of the present disclosure. The following claims are in no way intended to limit the scope of implementations of the present disclosure to the specific implementations described herein.

Various examples have been described. These and other examples are within the scope of the following claims.

What is claimed is:

1. A wafer processing system comprising:
a chamber;
a shutter disposed at an entrance of the chamber;
a vertical wafer boat for loading wafers;
an elevating member connected to a bottom of the vertical wafer boat; and
a first sensor and a second sensor, wherein the first sensor is disposed on a predetermined position of an elevating member, the second sensor is mounted under the shutter, and the first sensor and the second sensor are aligned for monitoring a path alongside the vertical wafer boat when the chamber is closed by the shutters;
wherein when the shutter moves to a predetermined position to make way for the vertical wafer boat, a detection of the first sensor and the second sensor is temporarily disabled; and
one of the first sensor and the second sensor transmits a signal along the path to another of the first sensor and the second sensor;
wherein the signal is blocked by one of the wafers falling out from the vertical wafer boat.

2. The wafer processing system of claim 1, further comprising a monitoring unit configured to receive data from the first sensor and the second sensor.

3. The wafer processing system of claim 2, wherein the monitoring unit generates an alert when the signal is blocked.

4. The wafer processing system of claim 1, wherein the chamber is a furnace for chemical vapor deposition.

5. The wafer processing system of claim 1, wherein the first sensor and the second sensor are laser sensors.

* * * * *